United States Patent [19]

Turley

[11] 4,409,483
[45] Oct. 11, 1983

[54] RADIANT ENERGY DIFFERENTIAL SENSOR SYSTEM

[75] Inventor: Alfred P. Turley, Glen Burnie, Md.

[73] Assignee: Westinghouse Electric Corp., Pittsburgh, Pa.

[21] Appl. No.: 194,720

[22] Filed: Oct. 7, 1980

[51] Int. Cl.³ .................. H01J 31/49; G01J 1/00; G01T 1/24; H01L 27/14
[52] U.S. Cl. .................. 250/332; 250/339; 250/370; 357/30
[58] Field of Search .......... 250/330, 332, 334, 338, 250/339, 370, 371; 357/30

[56] References Cited

U.S. PATENT DOCUMENTS

| | | | |
|---|---|---|---|
| 3,653,014 | 3/1972 | List et al. | 340/203 |
| 3,806,729 | 4/1974 | Caywood | 250/339 |
| 3,808,435 | 4/1974 | Bate et al. | 250/332 |
| 3,883,437 | 5/1975 | Nummedal et al. | 250/332 |
| 4,028,719 | 6/1977 | Curtis | 357/30 |
| 4,054,797 | 10/1977 | Milton et al. | 250/332 |
| 4,064,533 | 12/1977 | Lampe et al. | 250/332 |
| 4,093,872 | 6/1978 | Hartman et al. | 357/30 |
| 4,115,692 | 9/1978 | Balcerak et al. | 250/338 |
| 4,220,857 | 9/1980 | Bright | 250/339 |
| 4,362,938 | 12/1982 | Bosserman | 250/332 |

Primary Examiner—Alfred E. Smith
Assistant Examiner—Janice A. Howell
Attorney, Agent, or Firm—R. M. Trepp

[57] ABSTRACT

Apparatus for generating an electrical signal representative of differences in radiant energy of adjacent pixel points of a scene is described incorporating a first and second sensor for sensing radiant energy and a differential amplifier for taking the difference of the output signals of the sensors.

The invention overcomes the problem of storing and transferring large signals from the sensors by transferring the difference signals only.

16 Claims, 11 Drawing Figures

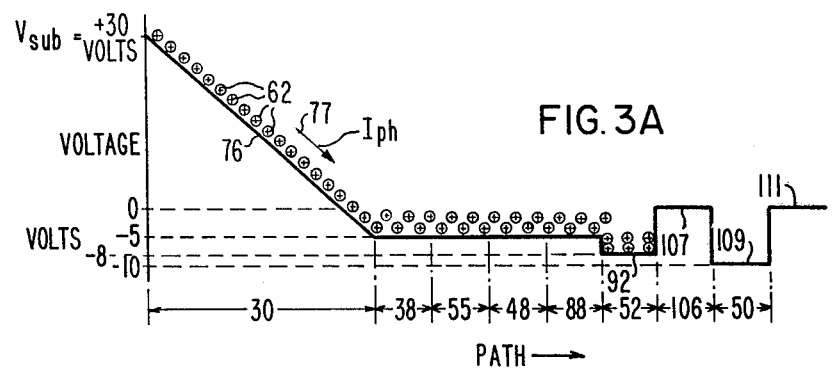
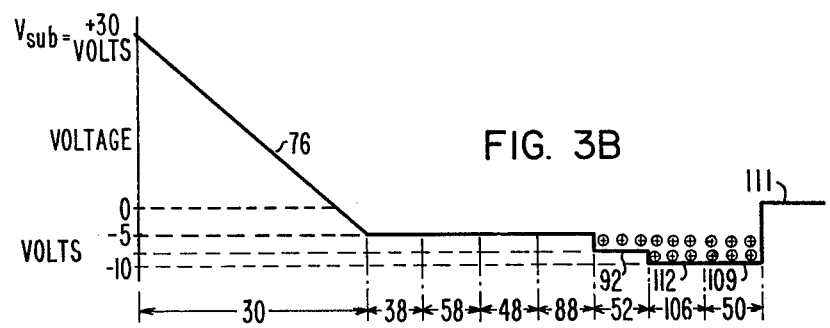
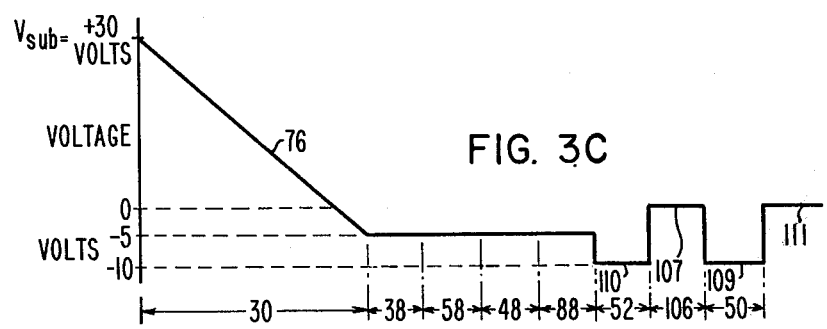

RADIANT ENERGY DIFFERENTIAL SENSOR SYSTEM

BACKGROUND OF THE INVENTION

1. Field of the Invention

This invention relates to radiant energy sensor systems and more particularly to an infrared sensor system employing a differential amplifier for removal of background radiation from the detected infrared radiation.

2. Description of the Prior Art

When thermal or infrared images are detected such as, for example, when the earth is viewed from a satellite in space, usually a relatively narrow continuous strip of the earth's surface is detected as the satellite orbits the earth. The infrared radiation from a target scene, detected by a sensor, contains background radiation energy which is on the order of 98% of the total target scene radiant energy detected. Infrared sensors made from extrinsic silicon such as Si:In or Si:Ga can take advantage of the well-developed silicon device design and processing techniques. Charge coupled device circuits are quite useful for signal processing in imaging applications and have been coupled with extrinsic silicon detectors to make an infrared imaging device. However, the charge-carrying capabilities of charge coupled devices (CCD) are limited. Target scene radiation energy containing the infrared background radiation levels can saturate the capacity of a CCD read-out register.

Previous attempts have been disclosed for removal of background radiant energy from the target scene. In U.S. Pat. No. 4,064,533, by D. R. Lampe et al. which issued on Dec. 20, 1977 and was assigned to the assignee herein, a CCD focal plane processor is disclosed having a plurality of columns of individual sensor elements with plural sensor elements per column. The structure includes plural CCD shift registers corresponding to the number of columns of sensors wherein each CCD shift register included a pair of stages corresponding to each of the element sensors. Two "snapshots" of a scene are taken at time-displaced intervals and are compared to detect differences therebetween to eliminate background or unchanging scene content and retain information regarding changes in scene items between shapshots. The CCD arrays must, however, handle the full amount of the signal charge generated.

U.S. Pat. No. 3,806,729, by J. M. Caywood which issued on Apr. 23, 1974, and U.S. Pat. No. 3,808,435, by R. T. Bate et al. which issued on Apr. 30, 1974, respectively, disclose an infrared imaging system which include an array of rows of CCD bits which collect charge alternatively from the target scene and from a uniform background reference source. A chopper is employed to provide the input to alternatively expose the CCD bits to the scene radiation and to the reference source and, by comparison, remove background radiation. On both patents, the CCD array must handle the full amount of the signal charge generated. U.S. Pat. No. 3,883,437, by K. Nummedal et al. which issued on May 13, 1975, discloses an image-scanned array of infrared radiation detectors wherein the signals are injected directly into a set of CCD registers for subsequent processing. Here, again, the CCD array must handle the full charge generated. U.S. Pat. No. 4,115,692 by R. S. Balcerak et al. which issued on Sept. 19, 1978, discloses a solid state pyroelectric detector read out device comprised of a two-dimensional pyroelectric detector array which is interfaced with an array of CCD's. The pyroelectric detector is utilized to reject background radiant energy from the detected radiation.

In U.S. Pat. No. 3,653,014 by W. F. List which issued on Mar. 28, 1972 and assigned to the assignee herein, apparatus is disclosed for enhancing small signal information by processing signals from a sensor array. The output levels of adjacent sensors are compared at the conclusion of each sampling interval by application to a differencing circuit followed by a logarithmic amplifier.

It is desirable, therefore, to provide a differential amplifier to remove radiant energy representing background and unchanged scene content from the detected radiation of a pair of infrared sensors and to retain only the differences between the radiation energies before transferring the signals from the sensor pair to a CCD read out register. Thus, the information related to constant signals corresponding to background radiation and unchanging scenes are removed.

SUMMARY OF THE INVENTION

In accordance with the present invention, a sensor system is provided for generating an electrical signal representative of differences in radiant energies detected by a first and second sensors during a predetermined time period, wherein said radiant energy from the target scene includes background radiation. The first sensor detects radiant energy of a target scene during the predetermined time period and provides an electrical signal proportional to the detected radiant energy. The second sensor concomitantly detects radiant energy from a second area on the target scene adjacent to the area detected by the first sensor and provides a second electrical signal proportional to said detected radiant energy. A differential amplifier is employed to compare the first and second electrical signals and for obtaining a difference signal representative of the difference between said first and second electrical signals representative of the radiant energy of changes in the target scene and independent of radiant energy of background radiation and unchanging target scene content. The difference signals are transferred to a CCD read-out register for signal processing.

BRIEF DESCRIPTION OF THE DRAWINGS

FIGS. 3A through 3C are potential plots of the sensor of FIG. 2 illustrating the flow of photocharges during the operation of the sensor.

DESCRIPTION OF THE PREFERRED EMBODIMENTS

Figure 1:
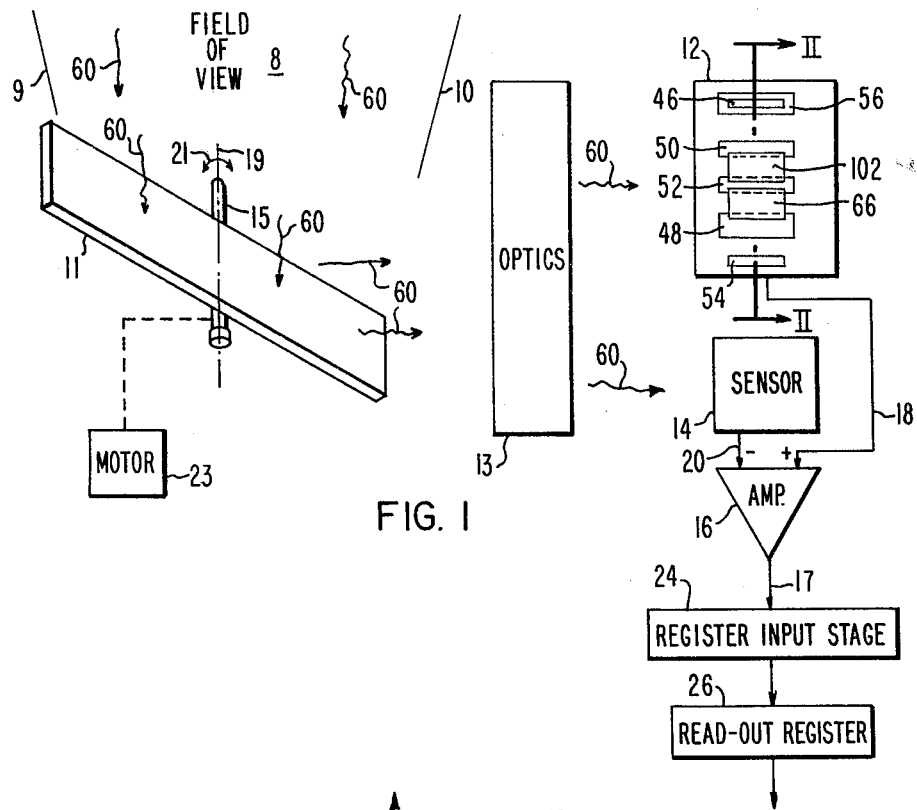
FIG. 1 is a block diagram of one embodiment of the invention.

In FIG. 1, sensors 12 and 14 function to generate electrical voltages in response to radiant energy 60 such as, for example, infrared radiation.

The radiant energy 60 incident upon sensors 12 and 14 may be from a scene 8 such as a portion of the earth's surface. Radiant energy 60 within a field of view having outer limits shown by reference lines 9 and 10 is reflected by mirror 11 through optics 13 into sensors 12 and 14. Mirror 11 is mounted on support 15 which may be rotated about axis 19 as shown by arrow 21. Motor 23 is coupled to support 15 for providing control of mirror 11 to cause mirror 11 to rotate, resulting in a scan of the radiant energy 60 from scene 8. In the embodiment shown in FIG. 1, radiant energy 60 from a pixel point of a series of pixel points is first directed at sensor 12 for a first predetermined time period and then at sensor 14 for a second predetermined time period. As mirror 11 scans a path in scene 8, radiant energy 60 of a sequence of adjacent pixel areas first passes into sensor 12 which generates a first signal in response to the incident radiation and then into sensor 14 which generates a second signal in response to the incident radiation. Sensor 12 would be receiving radiant energy 60 from an adjacent pixel point in sequence along the scan path. The voltages from sensors 12 and 14 are coupled to differential amplifier 16 on lines 18 and 20, respectively. The differential amplifier 16 provides a difference in amplitude between the two voltages of sensors 12 and 14 generated by radiant energy 60 from two adjacent pixel points. The output of differential amplifier 16 is coupled over line 17 to input stage 24 and read-out register 26. By taking the difference of the output voltage of sensors 12 and 14, differential amplifiers 16 will remove common components which are the same in adjacent pixels of radiant energy 60 detected by sensors 12 and 14 such as background radiation and unchanged scene content.

Figure 2:
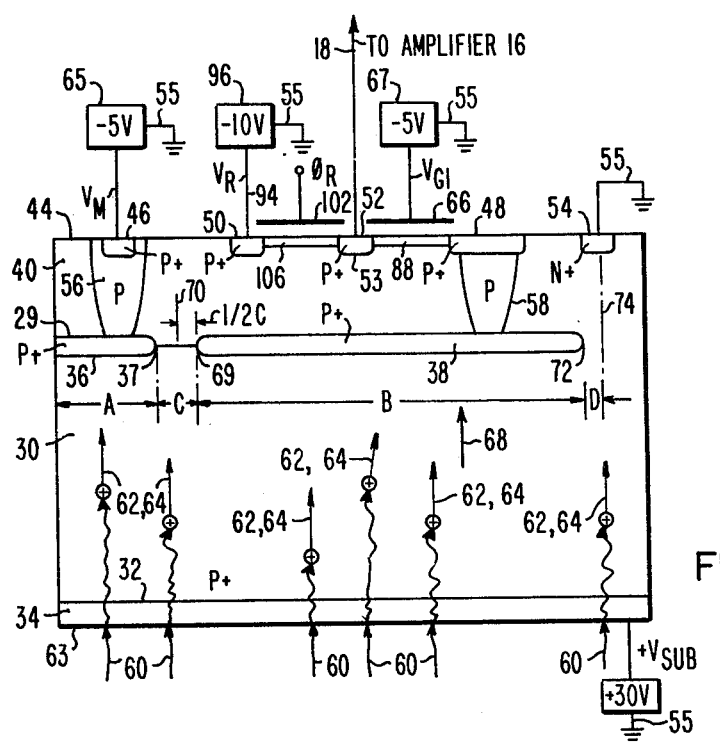
FIG. 2 is a cross-section view along the lines II—II of sensor 12 in FIG. 1.

FIG. 2 shows a cross-section view along the line II—II of sensor 12 shown in FIG. 1 having a substrate 30 of a semiconductor material such as silicon which has been treated with an appropriate dopant to make the resultant semiconductor material either P or N type. For illustrative purposes, sensor 12 will be described with substrate 30 being P type material having "holes" as majority carriers. For infrared detection, extrinsic silicon may have, for example, indium or gallium dopants to make a suitable P type substrate 30. Formed over the entire lower surface 32 of substrate 30 is a P+ layer 34 such as by doping with an appropriate material such as boron. P+ layer 34 is relatively transparent and highly conductive to wavelengths in the infrared region of the electromagnetic spectrum. Two P+ regions 36 and 38 of predetermined widths A and B respectively and separated by a predetermined distance C are formed in upper surface 29 of substrate 30. A layer 40 of N type epitaxial material is grown over upper surface 29 of substrate 30 and P+ regions 36 and 38. Layer 40 is of opposite conducting type from that of substrate 30 and P+ regions 36 and 38. Formed in upper surface 44 of layer 40 are P+ regions 46, 48, 50, 52 and 54. Formed through layer 40 is a P+ region 56 which provides a continuous electrically conductive path from P+ region 36 to P+ region 46. Likewise, formed through layer 40 is a P+ region 58 which provides a continuous electrically conductive path from P+ region 38 to P+ region 48. A gate electrode 102 is formed above surface 44 between P+ regions 50 and 52 to cause at times with electrical bias a channel 106 to form therebetween for the conduction of charges in the channel. A gate electrode 66 is formed above surface 44 between P+ regions 48 and 52 to cause at times with appropriate electrical bias a channel 88 to form therebetween for the conduction of charges in the channel.

Radiant energy 60 passes through P+ layer 34 and generates photocharges 62 within substrate 30. Face 63 and P+ layer 34 upon which radiant energy 60 impinges is at a predetermined potential $V_{sub}$ on the order of +30 volts from voltage source 51 with respect to the ground potential 55 in order to bias substrate 30 and P+ layer 34 with respect to layer 40. Consequently, the movement of photocharges 62 will be in the general direction from P+ layer 34 towards layer 40 as indicated by arrows 64 although the instantaneous movements of photocharges 62 are essentially random. P+ region 46 is connected to voltage source 65 where the voltage, $V_M$, is on the order of −5 volts; P+ region 56 and P+ region 36 are at the same voltage potential as P+ region 46. P+ region 48 is at a voltage potential determined by the voltage on gate 66 which is connected to voltage source 67 where the voltage, $V_{G1}$, is on the order of −5 volts; also, P+ region 58 and P+ region 38 are at the same voltage potential as region 48.

The operating temperature of sensor 12 may be in the range of 30° to 50° K. which causes P+ regions 36 and 38 to be of high conductivity with respect to photocharges 62 because of the boron dopant. Substrate 30 will be of low conductivity due to the appropriate dopant such as, for example, indium or gallium. Consequently, because of the voltage difference of 35 volts, for example, between P+ layer 34 and the P+ regions 36 and 38 and because of the high conductivity of P+ regions 36 and 38, photocharges 62 will move toward P+ regions 36 and 38 with the flow of photocharges 62 directly responsive to variations in the intensity of radiant energy 60 passing through P+ layer 34. The flow of photocharges 62 gives rise to a photocurrent $I_{ph}$ in the direction indicated by arrow 68. The instantaneous amplitude of photocurrent $I_{ph}$ corresponds to the instantaneous intensity of radiant energy 60. Photocharges 62 in the vicinity of the P+ region 36 are excess and are subsequently collected and removed by P+ regions 56 and 46 and flow to ground 55 through voltage source 65. The potential field of P+ region 36 includes its width A plus one-half of space C from end 37 of P+ region 36 to centerline 70 midway between P+ regions 36 and 38. A minimum of photocharges 62 will flow through space C between P+ regions 36 and 38 because of the potential field at end 37 of P+ region 36 and end 69 of P+ region 38. The potential field of P+ region 38 includes its width B plus half of space C from end 69 of P+ region 38 to center line 70 plus space D extending from end 72 of P+ region 38 to the centerline 74 of diode 54. The size of the potential field of P+ region 38 is predetermined by the pixel size and resolution required for the sensing system with which it is to be used. A pixel can be on the order of 50 to 100 microns.

Referring to FIGS. 2, 3A, 3B and 3C, the operation of sensor 12 in moving photocharges 62 in substrate 30 to P+ region 52 is shown. In FIGS. 3A, 3B and 3C, the ordinate represents voltage and the abscissa represents the path taken by photocharges 62. In FIG. 3A, the slope of the voltage gradient in substrate 30 is negative along curve 76 from layer 34 at a voltage of +30 volts to the P+ region 38 at a voltage of −5 volts. Photocharges 62 are shown "flowing" downward along curve 76 by arrow 77 representing $I_{PH}$ and passing through P+ regions 38, 58 and 48. Gate electrode 66 is at −5 volts causing a channel 88 to form in layer 40 between P+ regions 48 and 52; consequently photocharges 62 will pass through channel 88 to P+ region 52. P+ region 52 which was precharged to −10 volts functions as a collection well 53 and accumulates photocharges 62 draining from substrate 30 during a predetermined integration time period as shown in FIG. 3A.

The curve 92 showing the potential of accumulated photocharges in collection well 53 during the predetermined integration time period is dependent on the photocharges 62 created in substrate 30 in response to the intensity of radiant energy 60 and may be between −5 and −10 volts. FIG. 3A shows curve 92 representing the potential in the collection well 53 or P+ region 52 which is on the order of −8 volts. The potential underneath gate 102 or channel 106 in FIG. 2 is at ground potential as shown by curve 107. P+ region 50 is connected by line 94 to the voltage source 96 where the voltage $V_R$ is at a voltage level of −10 volts as shown by curve 109 in FIG. 3A. The potential in the space between P+ region 50 and P+ region 56 is at ground potential as shown by curve 111 in FIG. 3A.

At predetermined intervals, a reset clock pulse $\phi_R$ at gate 102 will cause a channel 106 to be formed for the time period of pulse $\phi_R$. As shown in FIG. 3B, photocharges 62 will "flow" from P+ region 52 at the voltage level shown by curve 92 to P+ region 50 at the voltage level shown by curve 109 via channel 106 at a potential of −10 volts shown by curve 112. The charge arriving at P+ region 50 will be "swept up" by voltage source 96, $V_R$ at −10 volts. During reset clock pulse $\phi_R$, no photocharges 62 are accumulated in P+ region 52 and collection well 53.

Referring to FIG. 3C, the photocharges 62 in collection well 53 or P+ region 52 have been "swept out" by the reset clock pulse $\phi_R$ and P+ region 52 is now at −10 volts as shown by curve 110. Channel 106 is a ground potential shown by curve 107. The potentials shown by the curves in FIG. 3C occur after reset clock pulse $\phi_R$ on gate 102.

Figure 4:
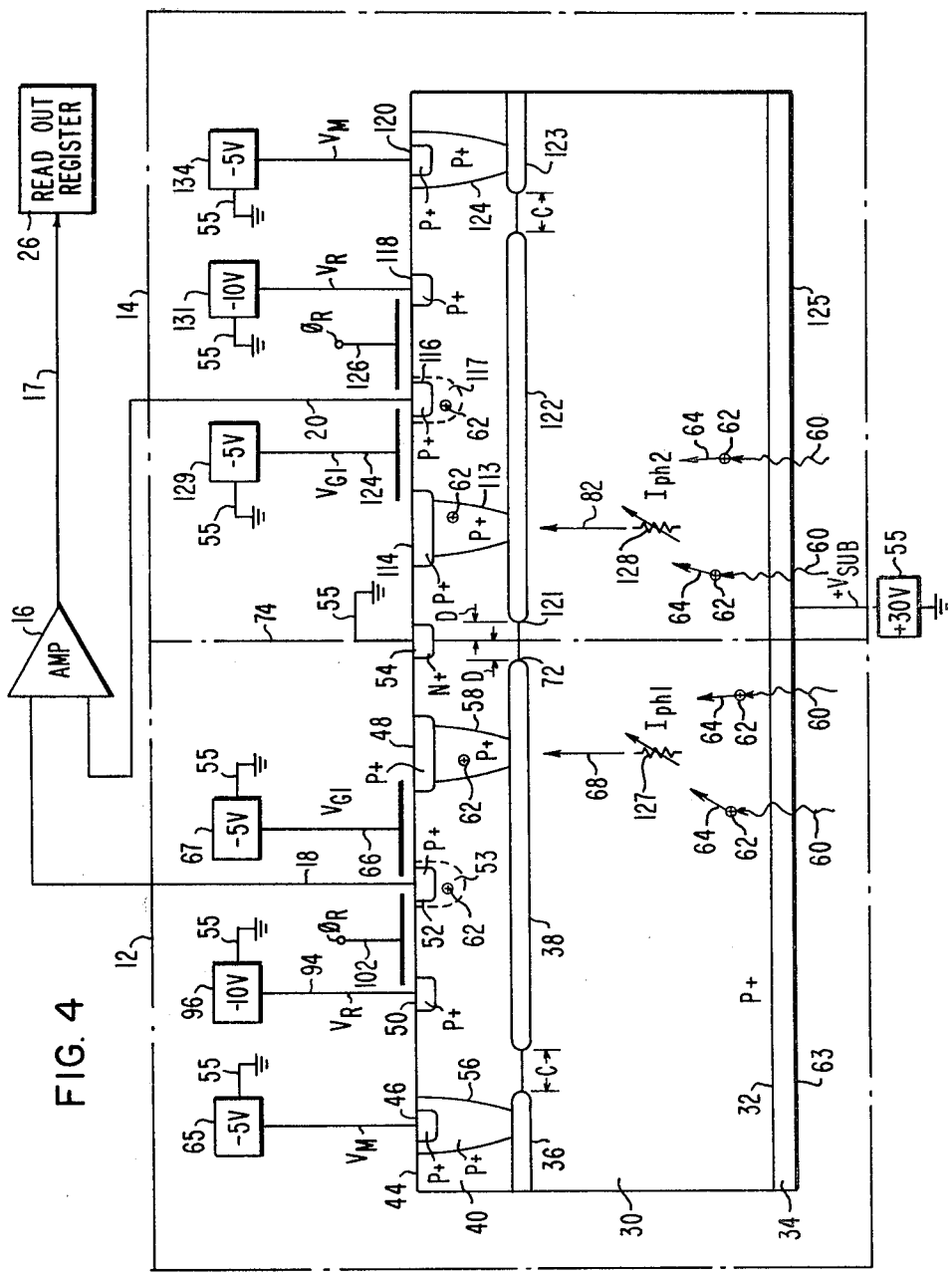
FIG. 4 is a cross-section diagram of sensors 12 and 14 of FIG. 1 on the same semiconductor chip and interconnected with a differential amplifier and read out register.

Referring to FIG. 4, sensors 12 and 14 are shown symmetrically disposed about the centerline 74. P+ regions 114, 116, 118 and 120 are at the same voltage levels and perform like functions as P+ regions 48, 52, 50 and 46, respectively. N+ region 54 is common to sensors 12 and 14. Voltage source 129 of sensor 14 is equal to the voltage source 67 of sensor 12 and voltage source 131 of sensor 14 is equal to the voltage source 96 of sensor 12. Voltage source 134 of sensor 14 is equal to the voltage source 65 of sensor 12. P+ region 122 is similar to P+ region 38 in collecting photocharges 62 for transmission via P+ region 113 to P+ region 114. End 121 of P+ region 122 is located a distance D from centerline 74. P+ region 123 collects excess photocharges 62 for removal via P+ region 124 to P+ region 120 and is similar in function to P+ region 36.

The reset clock pulses $\phi_R$ on gates 102 and 126 operate to sweep out the photocharges 62 from collection wells 53 and 117 of P+ regions 52 and 116, respectively, after they have accumulated charge 62 over a predetermined integration time interval.

The photogenerated currents $I_{ph1}$ and $I_{ph2}$ of sensors 12 and 14, respectively, are shown along paths represented by resistors 127 and 128, respectively; resistors 127 and 128 are shown to be variable to indicate resistance modulations due to changes in radiation intensity and corresponding changes in the creation of photocharges 62. Background radiation, may be relatively constant and may not be productive of modulations in the respective photocurrents $I_{ph1}$ and $I_{ph2}$. As scenes are continuously scanned in a direction from sensor 12 to sensor 14 by means well known in the art such as in the LANDSAT satellite, radiant energy 60 from the target area impinging on face 63 of sensor 12 will generally differ from the radiant energy 60 impinging on face 125 of sensor 14. When the intensity of the radiant energy detected by sensor 12 is not the same as that detected by sensor 14, there will be differences in the instantaneous amplitudes of the photogenerated currents $I_{ph1}$ and $I_{ph2}$ of sensor 12 and 14, respectively. There will be no difference in said photocurrents because of background radiation and unchanged scene content. Voltage levels in collection wells 53 and 117, which change with the accumulation of photocharges 62 over a predetermined time period as hereinbefore described, will also have differences corresponding to the differences in the intensity of radiant energy 60 at sensor 12 as contrasted with that at sensor 14.

Differential amplifier 16 compares the difference in voltage levels at P+ region 52 with that at P+ region 116. The voltage level of the difference voltage is coupled to read out register 26 over line 17 and, since background radiation is relatively constant, it will be cancelled out by the differential amplifier 16 and will not be passed on to read out register 26.

Figure 5:
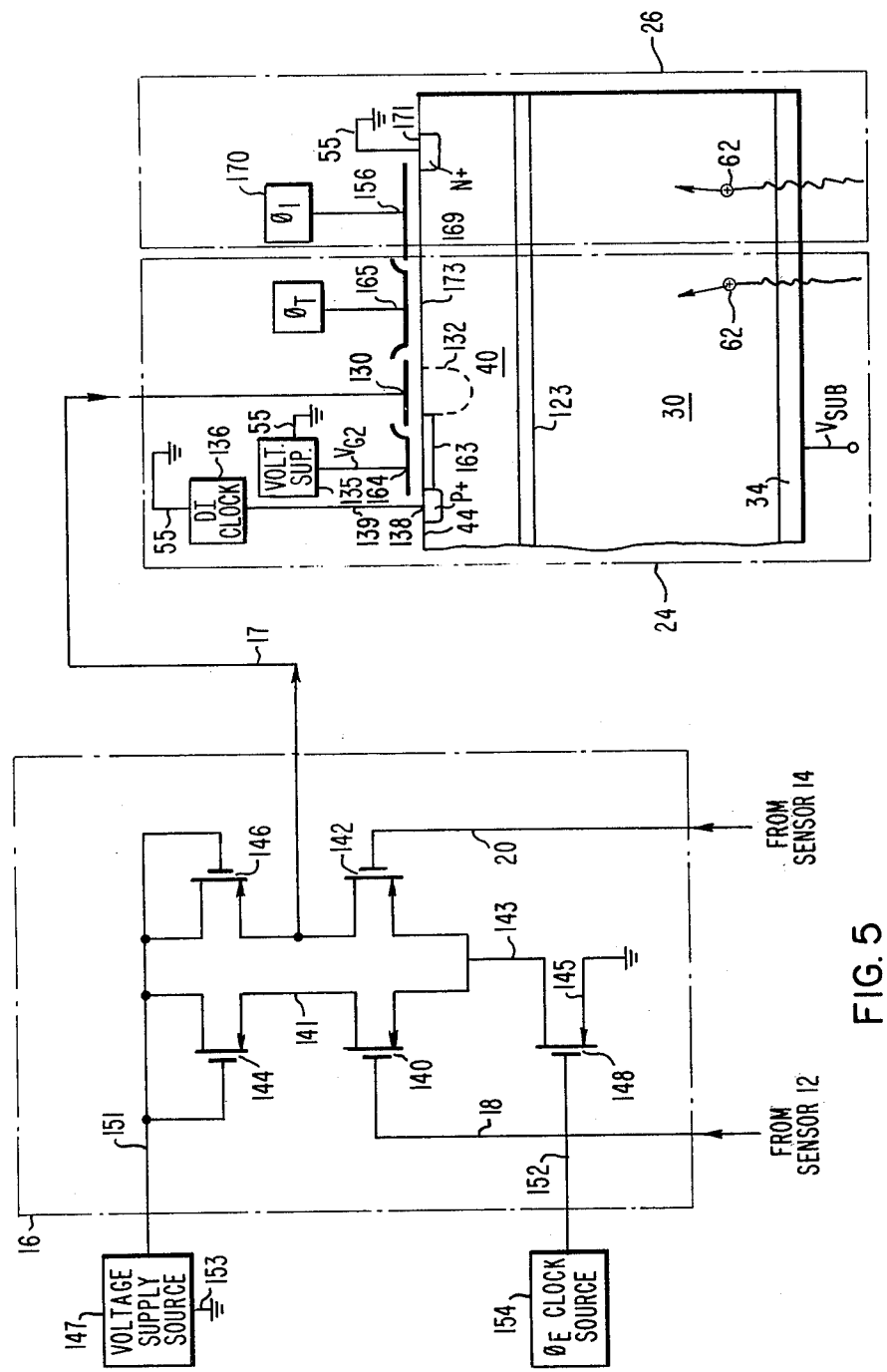
FIG. 5 is a schematic diagram of one embodiment of differential amplifier 16 of FIG. 1 and a cross-section view along the lines V—V of FIG. 1.

FIG. 5 shows a schematic diagram of an embodiment of differential amplifier 16 having voltage inputs on lines 18 and 20 from sensors 12 and 14, respectively, and a voltage output on line 17 to read-out register 26. In the preferred embodiment, read-out register 26 includes input stage 24 and is on the same semiconductor chip as are sensors 12 and 14 and differential amplifier 16.

As shown in FIG. 5, differential amplifier 16 has a first input on line 18 coupled to the gate of transistor 140 and a second input on line 20 coupled to the gate of transistors 142. The source of transistors 140 and 142 are coupled over line 143 to the drain of transistor 148. The source of transistor 148 is coupled over line 145 to ground potential. The drain of transistor 140 is coupled over line 141 to the source of transistor 144. The drain of transistor 142 is coupled over line 17 to the source of transistor 146 and to read out register 26. Voltage supply source 147 having a voltage of $V_B$ is coupled over line 151 to the gate and drain of transistors 144 and 146. Voltage supply source 147 has a terminal coupled to ground potential over line 153. Transistors 140 and 142 are the active amplifying transistors of differential amplifier 16. Transistors 144 and 146 are the resistive loads for transistors 140 and 142, respectively. Transistor 148 is the current source for differential amplifier 16. The gate of transistor 148 is coupled over line 152 to a $\phi_E$ clock source 154 which provides voltage pulses for predetermined time periods.

Transistor 148 conducts when a negative going voltage pulse is emitted by $\phi_E$ clock source 154. It is non-conductive when $\phi_E$ clock source 154 does not emit a pulse over line 152 which is then at ground potential and transistor 148 is in the non-conducting state. Consequently, no bias current will flow through differential amplifier 16 and the output voltage at line 17 will be clamped to voltage $V_B$ via transistor 146. However, during the period when the $\phi_E$ clock 154 emits a voltage pulse at its predetermined negative potenital on the order of $-5$ volts, transistor 148 will be conducting and bias current will flow through both transistors 140 and 144 and through both transistors 142 and 146, respectively. Thus, power amplification and dissipation take place only when the negative clock pulse is emitted by $\phi_E$ clock 154.

When the input voltages at the gate of transistors 140 and 142 are equal as when the voltage at collection well 53 is equal to that at collection well 117 shown in FIG. 4, a predetermined negative voltage will be on line 17 representing the radiant energy from background radiation and unchanged scene content. When the input voltages at the gate of transistors 140 and 142, respectively, are unequal, such as when the negative voltage at the gate of transistor 140 exceeds that of the gate of transistor 142, then the voltage at the source of transistor 144 will be more positive than that at the source of transistor 146 and the output voltage on line 17 will be greater than or more negative than said predetermined voltage. However, when the negative voltage at the gate of transistor 140 is less negative than that of the gate of transistor 142, then the voltage at the source of transistor 144 will be greater or more negative than that at the source of transistor 146 and the output voltage on line 17 will be less than or more positive than said predetermined voltage. If the voltage at the source of transistor 146 is much less than that at the source of transistor 144, then the output voltage level on line 17 will approach the voltage $V_B$. If the voltage at the source of transistor 146 is much greater than that at the source of transistor 144, then the output voltage on line 17 will approach ground potential 55. The output of differential amplifier 16 is connected by line 17 to gate 130 of input stage 24. The input stage 24 in FIG. 5 is well known to those skilled in the art for transferring a signal indicative of the voltage at gate 13 into charge for read-out register 26 which may be for example a CCD shift register.

Referring to FIGS. 4 and 5, photocharges 62 generated in substrate 30 of read-out register 26 are removed by collection through P+ region 123, P+ region 124 and P+ region 120, thence to voltage source 134. $V_M$ is on the order of $-5$ volts. Referring to FIG. 5, the differential amplifier voltage on line 17 at gate 130 creates a potential well 132 whose amplitude is representative of the voltage difference between the voltage output of sensor 12 on line 18 and the voltage output of sensor 14 on line 20. Diode 138 is connected by line 139 to DI clock 136 which emits a voltage pulse at predetermined times.

Figure 6:
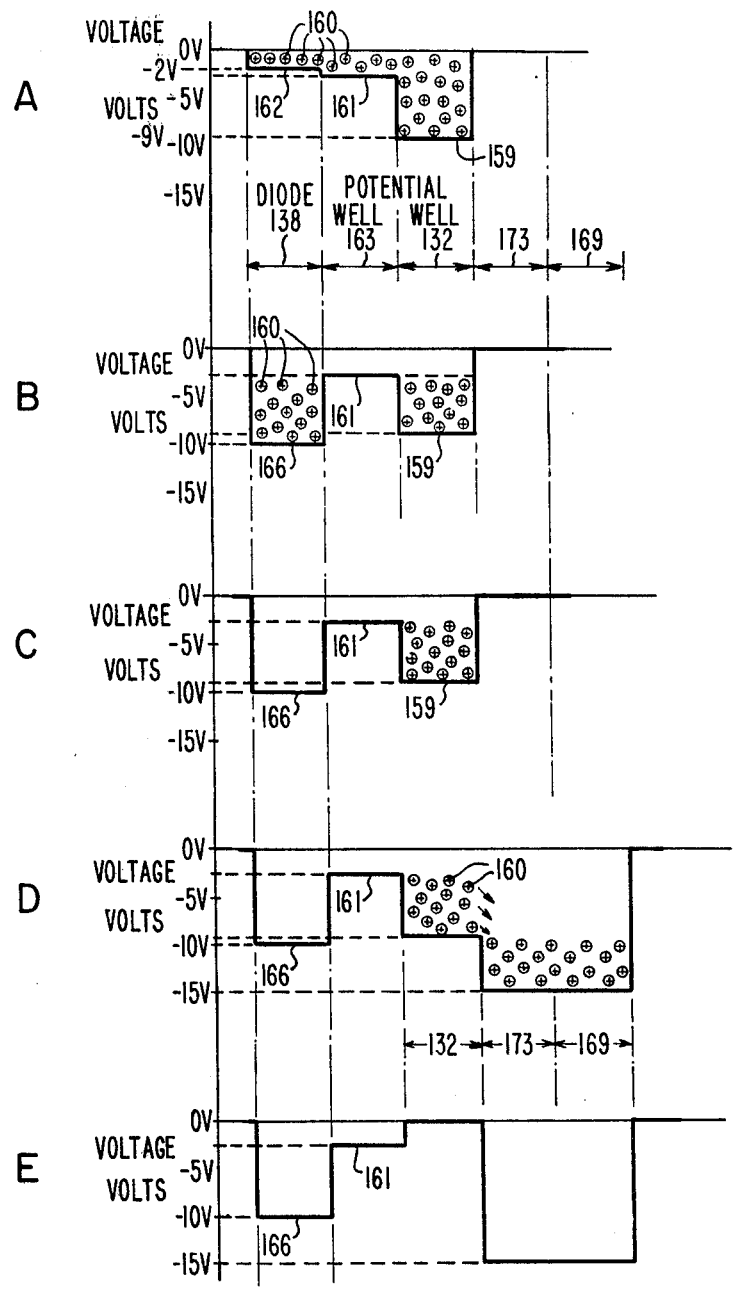
FIGS. 6A through 6E are potential plots of the CCD read-out register illustrating the flow of charges from the differential amplifier into the CCD read-out register of FIG. 5.

Referring to FIGS. 6A through 6E the operation of the input stage 24 of FIG. 5 is described. In FIGS. 6A through 6E, the ordinate represents voltage and the abscissa represents the path taken by charges 160. A pulse input from DI clock 136 provides charges 160 which flow into diode 138 to a voltage level on the order of $-2$ volts as shown by curve 162. Charges 160 "fill" diode or its P+ 138 region and "spill over" the potential well 163, beneath gate 164 shown by curve 161 into potential well 132, beneath gate 130 having a potential of $-9$ volts shown by curve 159. The voltage level of potential well 132 is dependent on the output from differential amplifier on line 17 at gate 130. The gate 165 is coupled to control signal $\phi_T$ which is at ground potential when diode 138 is at $-2$ volts during a clock pulse from DI clock 136. Charges 160 in diode 138, potential wells 163 and 132 are retained by potential well 173 below gate 165 which provides a voltage barrier to further "spilling over" by charges 160. When DI clock 136 resets after a predetermined time period to a voltage on the order of $-10$ volts as shown by curve 166 in FIG. 6B, all charges 160 which "spill back" into well 162 will be swept away by DI clock 136 and flow to DI clock 136 through diode 138. Charges 160 will remain in potential well 132 which are below the voltage level of potential well 163 as shown in FIG. 6C.

Referring to FIG. 6D, $\phi_T$ gate 165 of input stage 24 and gate 156 of the read-out register 26 go to a voltage on the order of $-15$ volts which causes charges 160 to "spill" over into potential wells 173 and 169 generated by $\phi_T$ gate 165 and gate 156.

FIG. 6E indicates the potential plot when charges 160 from potential well 169 are drained into the next stage of read-out register 26.

Figure 7:
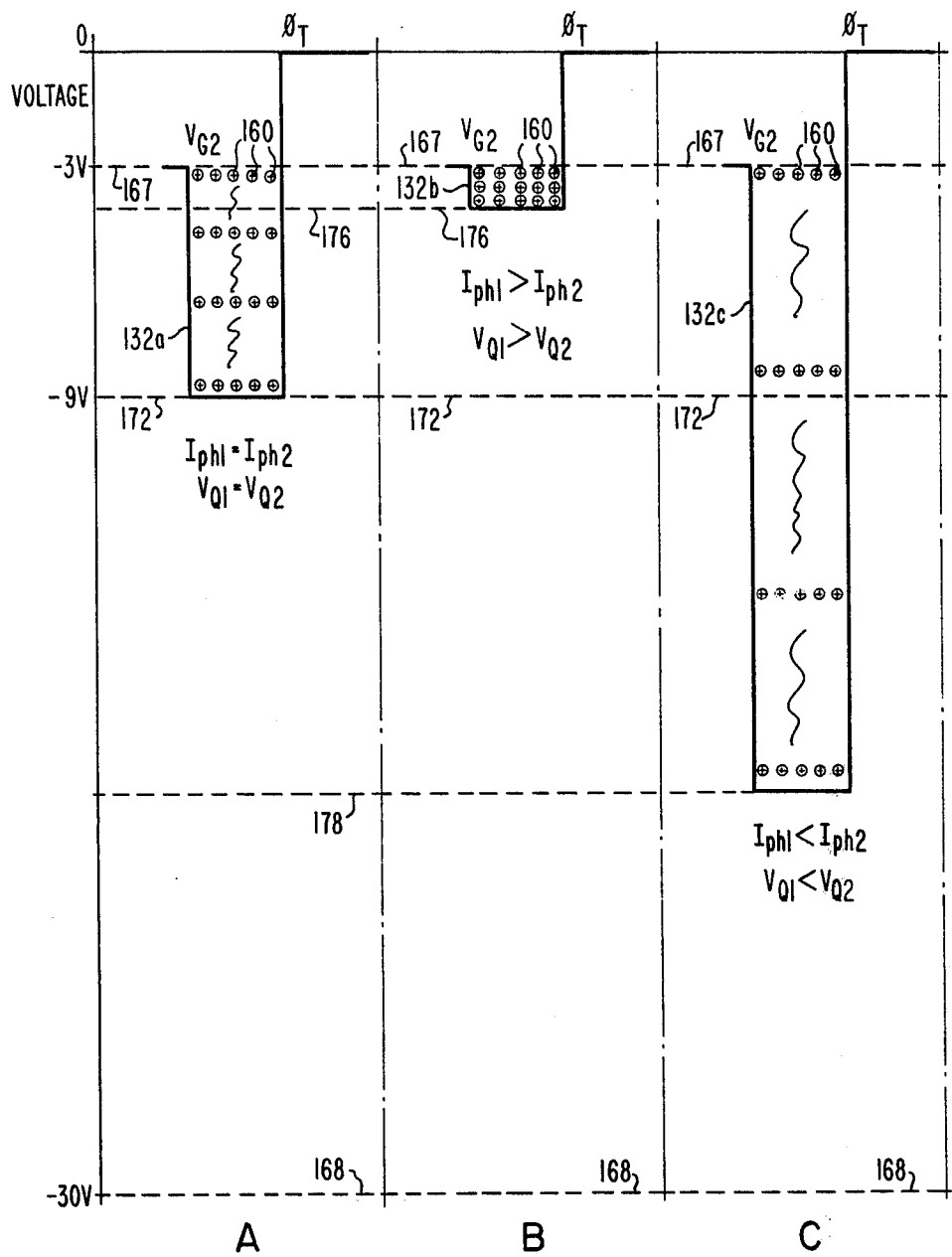
FIGS. 7A through 7C are potential plots of the potential well at the input of the CCD of FIGS. 6A through 6E explaining its operation.

For further description of potential well 132, reference is made to FIGS. 7A through 7C. In FIGS. 7A through 7C, the ordinate represents voltage and the abscissa represents the position of the charges 160. When the voltage outputs of sensors 12 and 14 are equal, potential well 132A in FIG. 7A will be at a predetermined voltage level 172 midway between the voltage level 167 of the potential well 163 below gate 164 and voltage level 168 of the potential well 173 below gate 165. Voltage level 172 is representative of background radiation and unchanging scene radiation. Voltage level 172 is on the order of $-9$ volts and well within the capabilities of input stage 24 of read-out register 26.

When the voltage ouput of sensor 12 is less negative than that of sensor 14, potential well 132B in FIG. 7B will be at a voltage level 176 which is between voltage levels 167 and 172. When the voltage output level of sensor 12 is more negative than that of sensor 14, potential well 132C in FIG. 7C will be at a voltage level 178 which is between voltage levels 172 and 168. The voltage level in well 132 is not limited to a particular level between voltage levels 167 and 168 but is dependent on the differences in the output voltages of sensors 12 and 14, respectively, which, in turn, are dependent on the variations in the intensity of radiant energy 60 passing into sensors 12 and 14 such as would be caused by scene variations.

FIGS. 8A through 8F show typical waveform diagrams for the operation of sensors 12 and 14, differential amplifier 16, and input stage 24, In FIGS. 8A through 8F the ordinate represents voltage and the abscissa represents time.

Figure 8:
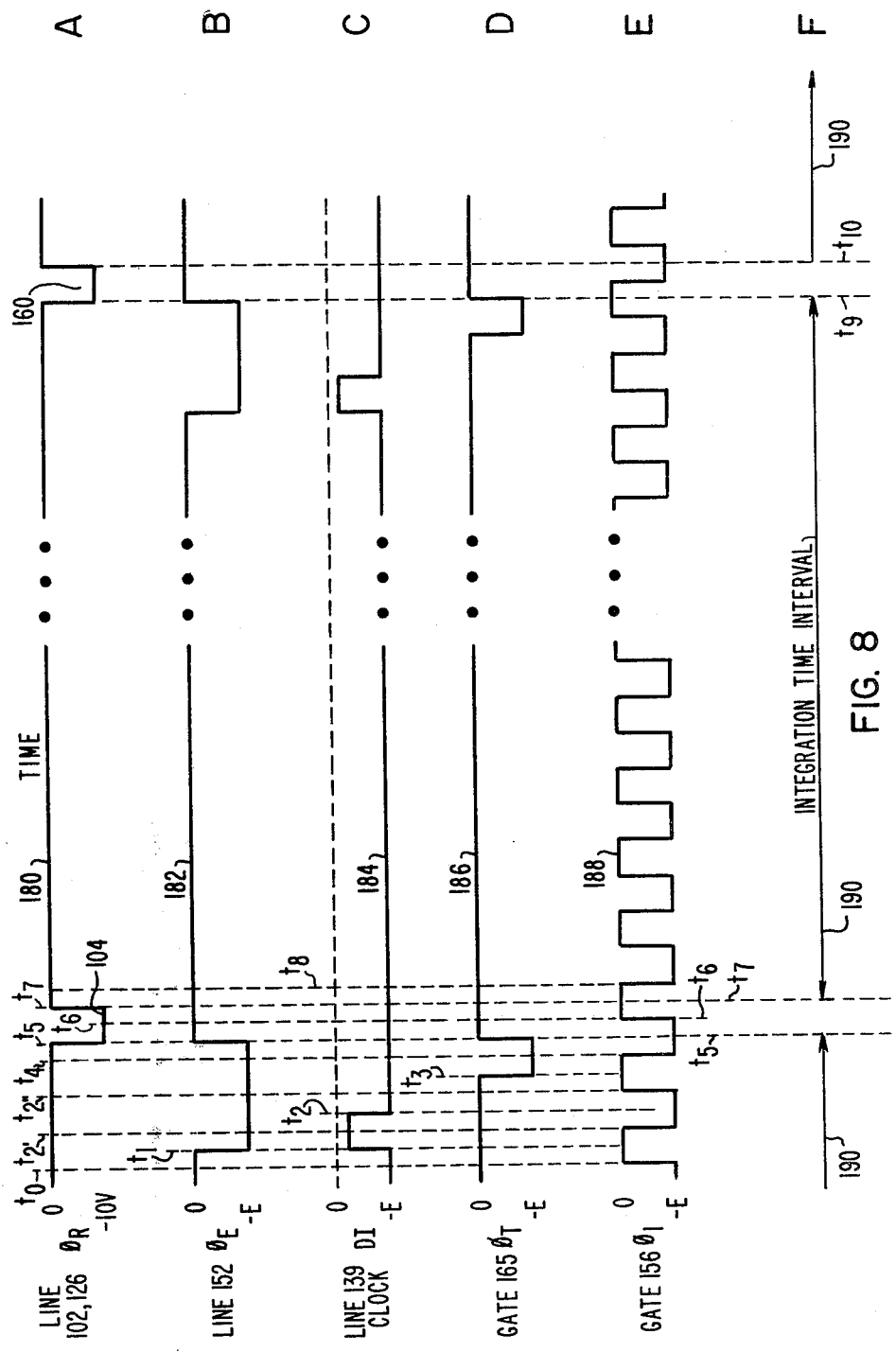
FIGS. 8A through 8F show typical waveforms for operation of the sensors, differential amplifier, and the CCD read-out register of FIGS. 1, 4 and 5.

In FIG. 8A, waveform 180 shows the voltage at gate 102 of FIG. 4. From $t_1$ to $t_5$ gate 102 is at ground potential and photocharges 62 are accumulating in collection well 53 shown in FIG. 4. From $t_5$ to $t_7$ gate 102 is set to $-10$ volts by control signal $\phi_R$; photocharges 62 are swept out of collection well 53 via channel 106, diode 50 and voltage source 96. P+ region 52 is reset to ground potential.

In FIG. 8B, waveform 182 shows the voltage on line 152 from $\phi_E$ clock source 154. From $t_1$ to $t_5$ the voltage on line 152 is at −E volts causing differential amplifier 16 to be enabled. Transistor 148 is turned on and the voltage inputs from sensors 12 and 14, respectively, are compared and the voltage difference is amplified for input into gate 130 of input stage 24. During $t_5$ to $t_7$, the voltage on line 152 is at 0 volts causing transistor 148 to be nonconducting and differential amplifier 16 to be "off".

In FIG. 8C, waveform 184 shows the voltage from DI clock 136 on line 139. From $t_1$ to $t_5$ the voltage on line 139 is at −E volts and the charges 160 flow into diode 135 and "spill over" to "fill" adjacent potential wells 163 and 132. Following $t_2$, DI clock 136 resets to a voltage level −E to sweep away all charges 160 in potential well 163 and those charges in potential well 132 above voltage level −E. Charges 160 remain in potential well 132 at a voltage level determined by the output voltage on line 17 from differential amplifier 16.

In FIG. 8D, waveform 186 shows the voltage of control signal $\emptyset_T$ on gate 165. From $t_1$ to $t_3$ when the $\emptyset_T$ gate 165 is at ground potential, gate 165 and its potential well 173 serves as a barrier to the escape of charges 160 from potential well 132 thus forcing charges 160 to accumulate over a time interval in potential well 132. During $t_3$ to $t_5$, control signal $\emptyset_T$ on gate 165 resets to voltage level −E volts to collect the charges 160 accumulated in potential well 132. Following $t_5$, $\emptyset_T$ gate 165 returns to ground potential to prevent charges 160 which accumulate in potential well 132 from escaping into the next stage of read-out register 26.

In FIG. 8E, waveform 188 shows the voltage at gate 156 from $\emptyset_1$ clock source 170. From $t_4$ to $t_5$ when gate 156 is at the same voltage level as is $\emptyset_T$ gate 165 in order to drain the charges from potential well 132 into potential well 169. A voltage barrier is created during the predetermined time period $t_6$ to $t_8$ to push the charges 160 in the next stage of read-out register 26. Waveform 188 shows a plurality of read-out register clock periods between $\emptyset_T$ pulses to indicate that there are as many clock periods between $\emptyset_T$ pulses as there are stages in the read-out register 26. For example, if read-out register 26 has four stages, then there would be four $\emptyset_T$ clock periods between each $\emptyset_T$ pulses.

The predetermined time interval 190 shown in FIG. 8E illustrates that a finite time period from $t_7$ to $t_9$ elapses for the accumulation of photocharges 62 in collection well 53 as a result of radiant energy 60 impinging on sensors 12 and 14.

Figure 9:
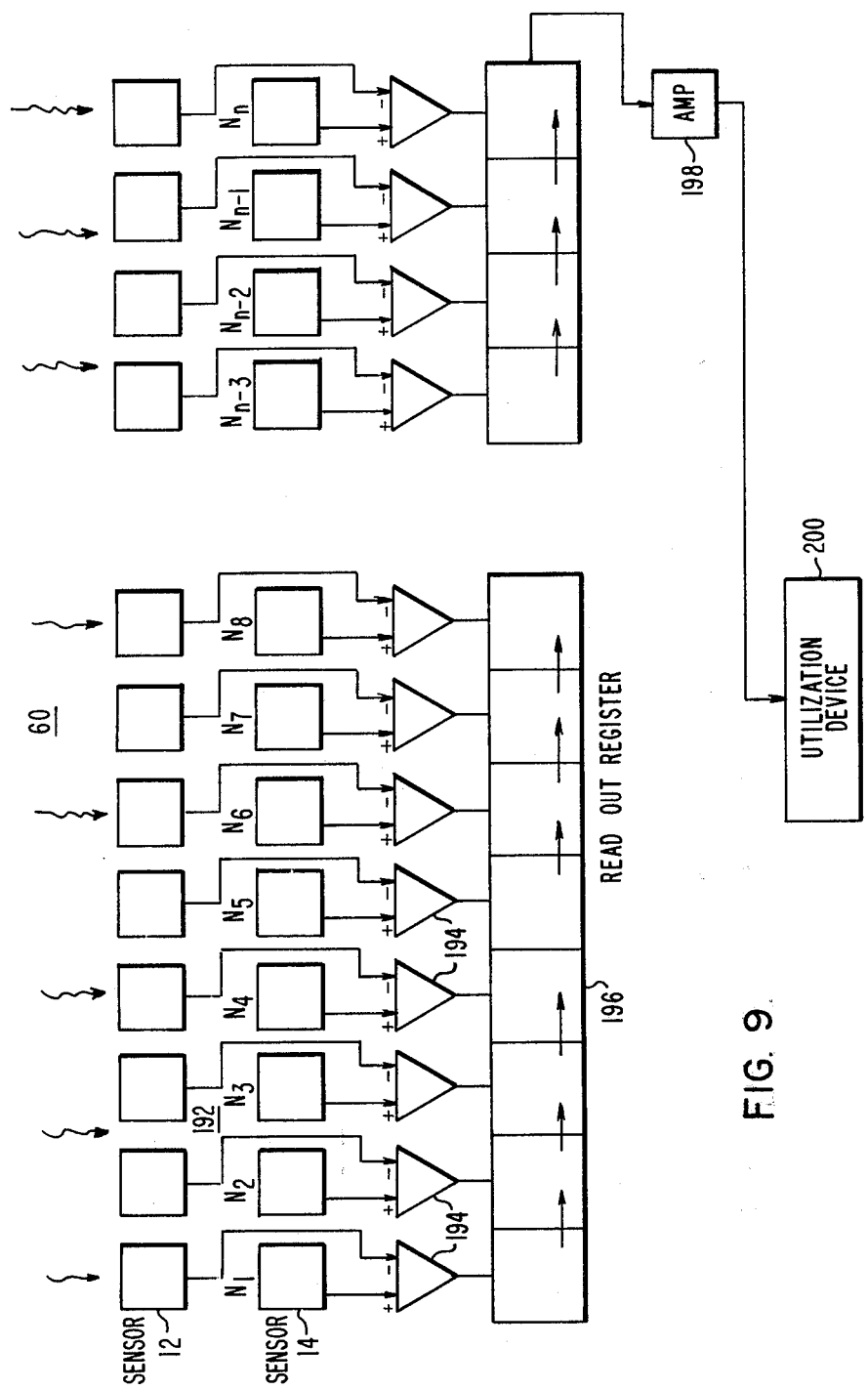
FIG. 9 shows a block diagram of an infrared sensing system where the combination of a plurality of signal outputs from the system shown in FIG. 1 are shown.

FIG. 9 shows a block diagram of a plurality of sensor pairs 192, $N_1$, $N_2$, ... $N_n$, differential amplifiers 194, read-out register 196, and output amplifier 198. The infrared signals from read-out register 196 are amplified by amplifier 198 and coupled to utilization device 200. In operation, the variations in radiant energy 60 in sensor pairs 92 are used to indicate the changing radiant energy 60 for the scene being viewed by one sensor as compared to the second sensor of the pair of sensors and to cancel out the effects of background radiation and unchanging scene content utilizing differential amplifiers 194.

The outputs of amplifiers 194 are parallel read into shift register 196 utilizing an input stage such as input stage 24 shown in FIG. 5. The shift register is read out in series by shifting the charge in each stage. The sensors, differential amplifiers and register 196 may be fabricated on one integrated circuit chip.

What is claimed is:

1. A system for generating an electrical signal representative of amplitude differences in radiant energy from adjacent areas of a target scene to remove unchanging target scene content and background radiation from said electrical signal, comprising:
   (a) means for scanning a target scene for directing radiant energy from two adjacent target areas to a first and second means for detecting radiant energy, respectively;
   (b) first and second means for detecting radiant energy including means responsive to said radiant energy for generating first and second electrical signals; and
   (c) means for comparing said first and second electrical signals to generate a difference signal representative of the difference between said first and second electrical signals representative of target scene radiant energy variations.

2. A system as recited in claim 1 wherein said radiant energy is in the infrared region of the electromagnetic spectrum.

3. A system as recited in claim 1 wherein said first and second means for detecting radiant energy are infrared sensors.

4. A system as recited in claim 1 wherein said means for comparing includes a differential amplifier.

5. A system as recited in claim 1, further including a plurality of pairs of first and second means for detecting radiant energy, and a plurality of said means for comparing electrical outputs respectively associated with each said pair of first and second means.

6. A system for generating an electrical signal representative of amplitude differences in radiant energy from adjacent areas of a target scene to remove unchanging target scene content and background radiation from said electrical signal, comprising:
   (a) means for scanning a target scene for directing radiant energy from two adjacent target areas to a first and second means for detecting radiant energy, respectively;
   (b) first and second means for detecting radiant energy including means responsive to said radiant energy for generating first and second electrical signals;
   (c) means for comparing said first and second electrical signals to generate a difference signal representative of the difference between said first and second electrical signals;
   (d) means coupled to said means for comparing for storing and transferring said difference signals to an output terminal.

7. A system as recited in claim 6 wherein said radiant energy is in the infrared region of the electromagnetic spectrum.

8. A system as recited in claim 6, wherein said first and second means for detecting radiant energy are infrared sensors.

9. A system as recited in claim 6 wherein said means for comparing includes a differential amplifier.

10. A system as recited in claim 6 wherein said means for storing and transferring includes a charge coupled device shift register.

11. A system as recited in claim 10 wherein said charge coupled device shift register includes an input stage.

12. A system as recited in claim 6, further including a plurality of pairs of first and second means for detecting radiant energy, and a plurality of said means for comparing electrical outputs respectively associated with each said pair of first and second means.

13. A system as recited in claim 12 wherein said means for storing and transferring included a charge coupled device shift register of a plurality of stages and means for coupling data in parallel into said stages.

14. A system for generating an electrical signal representative of differences in radiant energy from adjacent target scene areas detected by a first means and a second means, respectively, wherein said radiant energy from the target scene includes background radiation, comprising in combination:
(a) first means for detecting target scene radiant energy during a predetermined time period and providing a first electrical signal as a function of said radiant energy detected;
(b) second means for detecting target scene radiant energy during said predetermined time period and providing a second electrical signal as a function of said detected radiant energy;
(c) means for comparing said first and second electrical signals and for obtaining a difference signal representative of the difference between said first and second electrical signals representative of target scene radiant energy variations;
(d) means coupled to said means for comparing for storing and transferring said difference signals to an output terminal; and
wherein said first and second means for detecting radiant energy, said means for comparing said first and second electrical signals, and said means for storing and transferring said difference signals, are physically part of a common semiconductor chip.

15. A method for generating an electrical signal representative of differences in radiant energy from adjacent target scene areas detected by a first means and a second means, respectively, wherein said radiant energy from the target scene includes background radiation, comprising the steps of:
(a) detecting target scene radiant energy during a predetermined time period and providing a first electrical signal as a function of said radiant energy detected;
(b) detecting target scene radiant energy during said predetermined time period and providing a second electrical signal as a function of said radiant energy; and
(c) comparing said first and second electrical signals to generate a difference signal representative of the difference between said first and second electrical signals.

16. A method for generating an electrical signal representative of differences in radiant energy from adjacent target scene areas detected by a first means and a second means, respectively, wherein said radiant energy from the target scene includes background radiation, comprising the steps of:
(a) detecting target scene radiant energy during a predetermined time period and providing a first electrical signal as a function of said radiant energy detected;
(b) detecting target scene radiant energy during said predetermined time period and providing a second electrical signal as a function of said radiant energy;
(c) comparing said first and second electrical signals to generate a difference signal representative of the difference between said first and second electrical signals; and
(d) storing and transferring said difference signals to an output terminal.

* * * * *